(12) United States Patent (10) Patent No.: US 12,690,177 B2

Nagumo (45) Date of Patent: Jul. 21, 2026

(54) ELECTRIC POWER CONVERSION UNIT FOR IMPROVING COOLING EFFICIENCY

(71) Applicant: TMEIC Corporation, Tokyo (JP)

(72) Inventor: Kenshi Nagumo, Tokyo (JP)

(73) Assignee: TMEIC CORPORATION, Tokyo (JP)

( * ) Notice: Subject to any disclaimer, the term of this patent is extended or adjusted under 35 U.S.C. 154(b) by 227 days.

(21) Appl. No.: 18/580,732

(22) PCT Filed: Jun. 17, 2022

(86) PCT No.: PCT/JP2022/024341

§ 371 (c)(1),
(2) Date: Jan. 19, 2024

(87) PCT Pub. No.: WO2023/243082

PCT Pub. Date: Dec. 21, 2023

(65) Prior Publication Data

US 2024/0237310 A1 Jul. 11, 2024

(51) Int. Cl.
*H05K 7/20* (2006.01)
*H05K 7/14* (2006.01)

(52) U.S. Cl.
CPC ..... *H05K 7/20918* (2013.01); *H05K 7/20536* (2013.01); *H05K 7/20572* (2013.01); *H05K 7/20909* (2013.01); *H05K 7/14325* (2022.08)

(58) Field of Classification Search
CPC .......... H05K 7/20536; H05K 7/20572; H05K 7/20909; H05K 7/20918; H05K 7/1432
See application file for complete search history.

(56) References Cited

U.S. PATENT DOCUMENTS

| | | | | |
|---|---|---|---|---|
| 8,134,832 | B2 * | 3/2012 | Silvennoinen ..... | H05K 7/20909 |
| | | | | 174/15.1 |
| 10,347,561 | B2 * | 7/2019 | Harada ................. | H02M 7/003 |
| 2025/0070654 | A1 * | 2/2025 | Song .................. | H05K 7/20509 |
| 2025/0185221 | A1 * | 6/2025 | Song .................... | H02M 3/003 |

FOREIGN PATENT DOCUMENTS

| | | | | |
|---|---|---|---|---|
| CN | 206790360 | U | 12/2017 | |
| EP | 3 462 592 | A1 | 4/2019 | |
| JP | 2003-45632 | A | 2/2003 | |
| JP | 2012186352 | A * | 9/2012 | |
| JP | 2016220416 | A * | 12/2016 | ........... H02M 7/003 |
| JP | 6163835 | B2 * | 7/2017 | |
| WO | WO 2011/001568 | A1 | 1/2011 | |

OTHER PUBLICATIONS

International Search Report mailed on Sep. 13, 2022 in PCT/JP2022/024341 filed on Jun. 17, 2022 (citing references 17, 18 therein, 4 pages).

* cited by examiner

*Primary Examiner* — Zachary Pape

(74) *Attorney, Agent, or Firm* — Knobbe, Martens, Olson & Bear, LLP

(57) ABSTRACT

An electric power conversion unit includes a housing, a plurality of fans, a heat sink, and a plurality of semiconductor elements. The fan generates a flow of air at an inside of the housing. The heat sink forms a flow path of the air on an upstream side of a flow route of the air at the inside of the housing. The plurality of semiconductor elements is arranged and aligned along a direction which intersects a flow direction of the air in the heat sink on an element arrangement plane of the heat sink.

2 Claims, 5 Drawing Sheets

ELECTRIC POWER CONVERSION UNIT FOR IMPROVING COOLING EFFICIENCY

TECHNICAL FIELD

An embodiment of the present invention relates to an electric power conversion unit.

BACKGROUND

In the related art, an electric power conversion device is known which includes a heat sink on which a switching element as a heat generation source is mounted.

However, in a heat sink on which a plurality of switching elements is mounted, there is a possibility that by a ventilation path of cooling air being elongated, a pressure loss of the cooling air is increased, and by a temperature gradient along the ventilation path being increased, cooling efficiency is reduced.

RELATED ART DOCUMENTS

Patent Documents

[Patent Document 1]
Japanese Unexamined Patent Application, First Publication No. 2003-45632
[Patent Document 2]
PCT International Publication No. 2011/001568

SUMMARY OF INVENTION

Problems to be Solved by the Invention

A problem to be solved by the present invention is to provide an electric power conversion unit capable of improving cooling efficiency.

Means for Solving the Problem

An electric power conversion unit of an embodiment includes a housing, a fluid machine, a heat release member, and a plurality of elements. The fluid machine generates a flow of a refrigerant inside the housing. The heat release member forms a flow path of the refrigerant on an upstream side of a flow route of the refrigerant at the inside of the housing. The plurality of elements is arranged and aligned along a direction which intersects a flow direction of the refrigerant in the heat release member on an element arrangement plane of the heat release member.

DESCRIPTION OF THE EMBODIMENTS

Hereinafter, an electric power conversion unit of an embodiment will be described with reference to the drawings.

Figure 1:
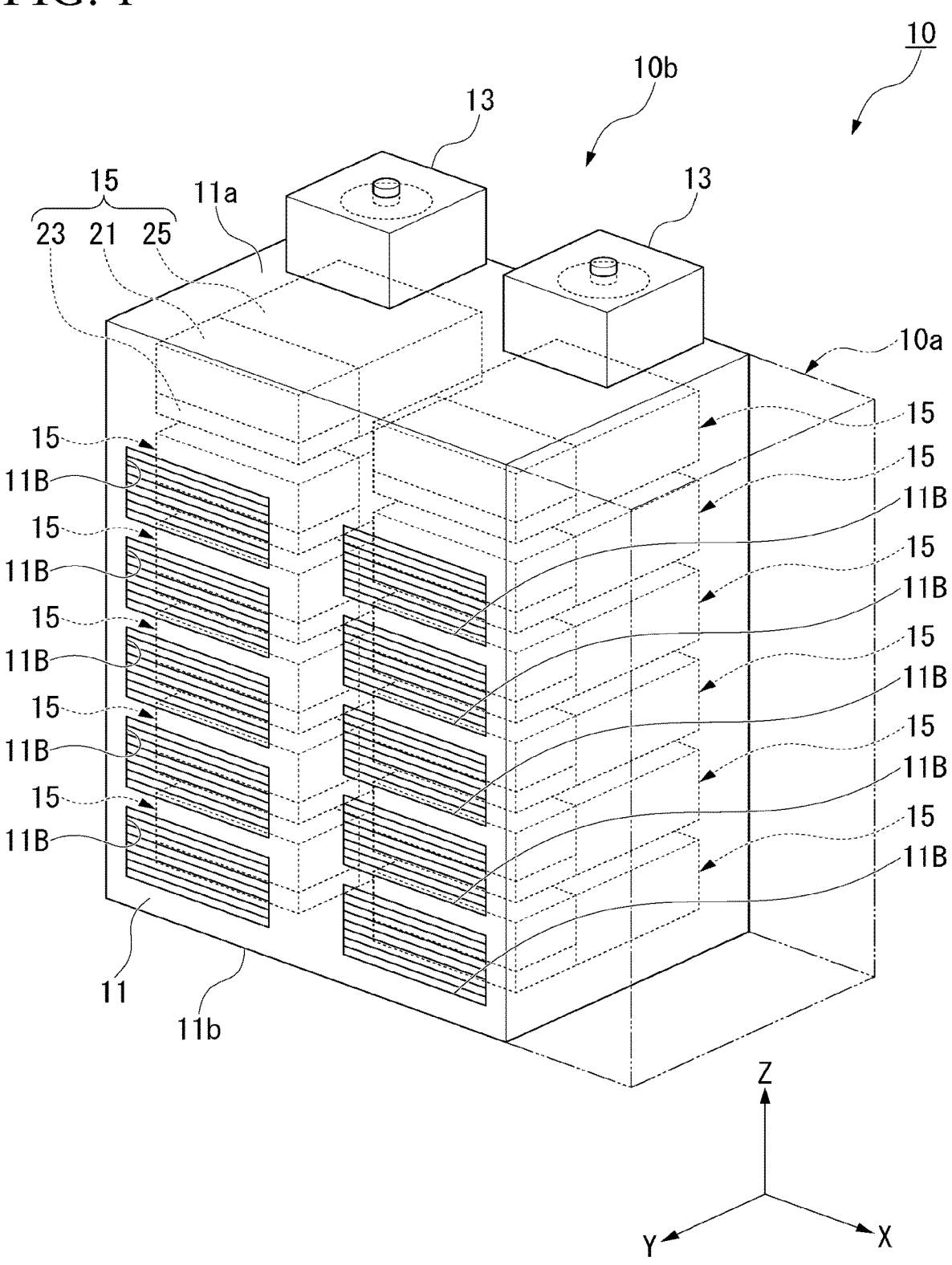
FIG. 1 is a perspective view showing a configuration of an electric power conversion unit of an embodiment.

FIG. 1 is a perspective view showing a configuration of an electric power conversion unit 10 of an embodiment.

Hereinafter, each axis direction of the X-axis, the Y-axis, and the Z-axis orthogonal to one another in a three-dimensional space is in a direction parallel to each axis. For example, as shown in FIG. 1, the X-axis direction is parallel to a rightward-leftward direction of the electric power conversion unit 10. The Y-axis direction is parallel to a forward-rearward direction of the electric power conversion unit 10. The Z-axis direction is parallel to an upward-downward direction of the electric power conversion unit 10.

The electric power conversion unit 10 of the embodiment is, for example, a board provided on an electrical facility or the like. The board is a switchboard, a distribution board, a control board, and the like that constitute an electric power supply apparatus, a motor drive apparatus, and the like. The electric power conversion unit 10 includes, for example, a variety of circuit components such as a semiconductor element, a conductor, a fuse, a capacitor (condenser), a transformer, a switch, a circuit breaker, and a measurement device.

As shown in FIG. 1, the electric power conversion unit 10 includes, for example, an operation part 10a and an electric power control part 10b. The operation part 10a receives, for example, an input operation of an operator regarding an operation of the electric power control part 10b. The operation part 10a outputs a signal that commands an operation of the electric power control part 10b in response to the input operation of the operator. The operation part 10a includes, for example, an input device such as an operation button and a display device such as a liquid crystal display.

The electric power control part 10b includes, for example, a housing 11, a plurality of fans (an example of a fluid machine in the claims) 13, and a plurality of electric power control units 15.

An upper portion 11a in the Z-axis direction of the housing 11 supports the plurality of fans 13. A discharge port 11A (refer to FIG. 4 described later) formed on the upper portion 11a faces and is in communication with each fan 13, for example, along the Z-axis direction. A plurality of intake ports 11B formed on a front portion 11b in the Y-axis direction of the housing 11 is opposed to and faces an appropriate electric power control unit 15, for example, along the Y-axis direction. Each intake port 11B is, for example, an opening having a rectangular shape.

The housing 11 supports the plurality of electric power control units 15 arranged at the inside of the housing 11.

The plurality of fans 13 is, for example, two fans 13. Each fan 13 suctions air at the outside of the housing 11 from each intake port 11B of the front portion 11b of the housing 11 to the inside of the housing 11. Each fan 13 discharges air at the inside of the housing 11 from the discharge port 11A of the upper portion 11a of the housing 11 to the outside of the housing 11. Each fan 13 cools the plurality of electric power control units 15 by cooling air F formed of air that flows through the inside of the housing 11.

The plurality of electric power control units 15 are, for example, twelve electric power control units 15. The plurality of electric power control units 15 are aligned, for example, in six columns in the Z-axis direction and in two rows in the X-axis direction and are arranged at an inside of the housing 11. Among the plurality of electric power control units 15, each electric power control unit 15 other than the electric power control units 15 in two rows at the uppermost column is arranged to be opposed to and face each intake port 11B of the housing 11, for example, along the Y-axis direction.

Each electric power control unit 15 includes, for example, an element unit 21, a drive unit 23, and a capacitor unit 25.

Figure 2:
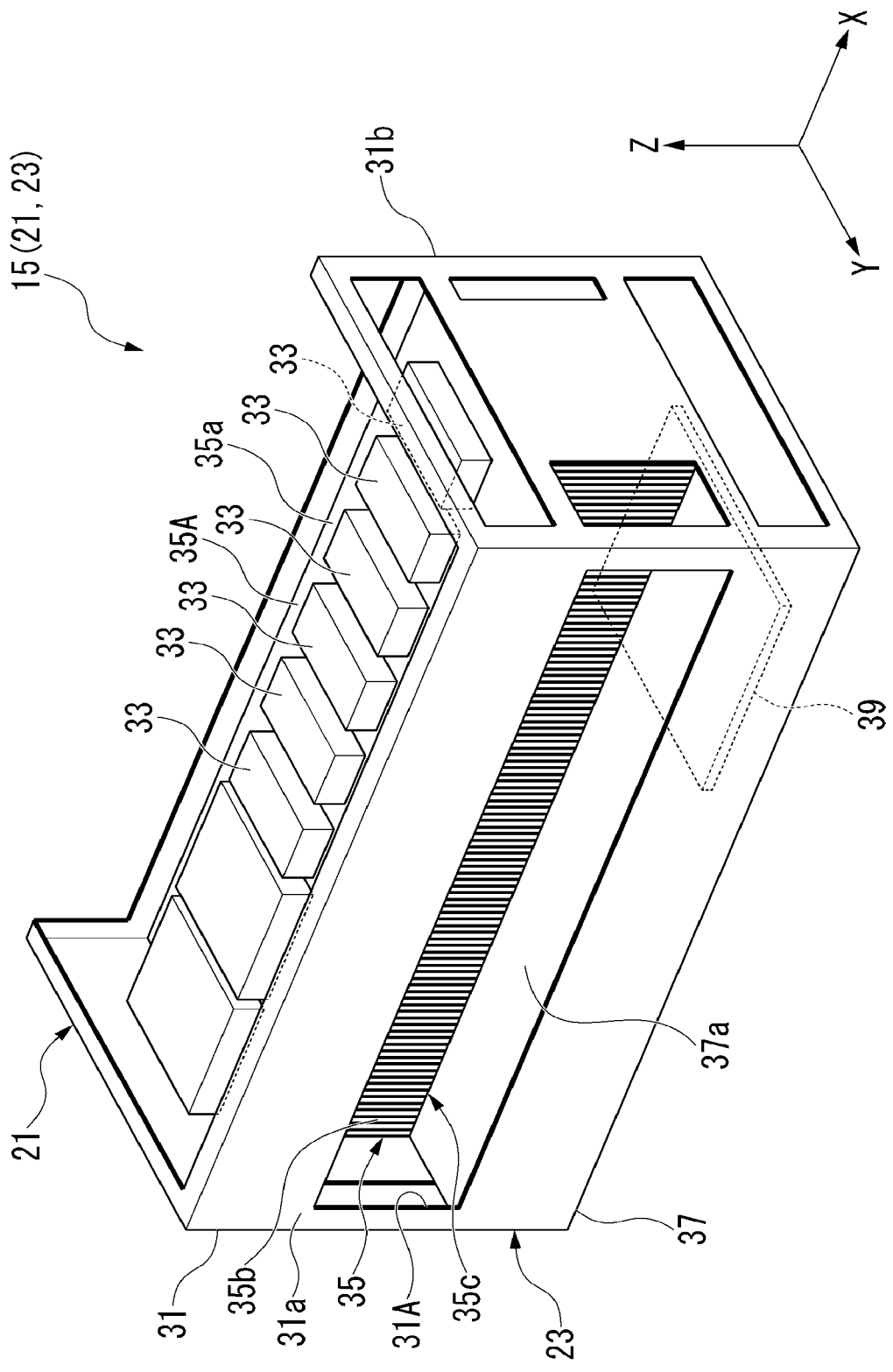
FIG. 2 is a perspective view showing a configuration of an element unit and a drive unit in the electric power conversion unit of the embodiment.

FIG. 2 is a perspective view showing a configuration of the element unit 21 and the drive unit 23 in the electric power conversion unit 10 of the embodiment.

As shown in FIG. 2, the element unit 21 and the drive unit 23 are arranged to be laminated, for example, along the Z-axis direction.

The element unit 21 includes a first unit housing 31, a plurality of semiconductor elements (first element) 33, and a heat sink (an example of a heat release member in the claims) 35. The first unit housing 31 supports the plurality of semiconductor elements (an element in the claims, an example of a first element) 33 and the heat sink 35 at the inside of the first unit housing 31. A front opening 31A and a rear opening 31B (refer to FIG. 5 described later) that faces and is in communication with the heat sink 35, for example, along the Y-axis direction are formed on a front portion 31a and a rear portion 31b in the Y-axis direction of the first unit housing 31.

The plurality of semiconductor elements 33 are, for example, a plurality of switching elements, a plurality of rectifier elements, and the like that form a bridge circuit by being connected together according to bridge connection. The switching element is a transistor such as an IGBT (Insulated Gate Bipolar Transistor) or a MOSFET (Metal Oxide Semi-Conductor Field Effect Transistor). The rectifier element is a diode connected to each transistor in parallel.

The plurality of semiconductor elements 33 are arranged on an element arrangement plane 35A of the heat sink 35. The element arrangement plane 35A of the heat sink 35 is, for example, an upper end surface of an upper portion 35a in the Z-axis direction of the heat sink 35. The plurality of semiconductor elements 33 are arranged, for example, to be aligned in one row along the X-axis direction on the element arrangement plane 35A.

The outer shape of the heat sink 35 is, for example, a cuboid shape. The length along the Y-axis direction of the heat sink 35 is formed, for example, to be larger by a predetermined length than the length in the Y-axis direction of each semiconductor element 33 arranged on the element arrangement plane 35A. The predetermined length is, for example, about a length required for fixing each semiconductor element 33 to the element arrangement plane 35A or the like.

The heat sink 35 includes a plurality of fin members 35b. The outer shape of each fin member 35b is, for example, a plate shape parallel to the Y-Z plane. The plurality of fin members 35b extend downward in the Z-axis direction from the upper portion 35a and are in contact with a partition member 37a of the drive unit 23 described later. The plurality of fin members 35b are arranged to be aligned at a predetermined interval along the X-axis direction.

The plurality of fin members 35b of the heat sink 35 form a flow path 35c of air that flows through the inside of the housing 11. The flow direction of the air in the heat sink 35 is set to be parallel to the Y-Z plane by the plurality of fin members 35b.

The drive unit 23 includes a second unit housing 37 and a substrate 39. The second unit housing 37 supports the substrate 39 arranged at the inside of the second unit housing

37. The second unit housing 37 includes the partition member 37a. The partition member 37a separates the inside of the second unit housing 37 where the substrate 39 is arranged from the flow path 35c of the air formed by the heat sink 35.

The outer shape of the partition member 37a is, for example, a plate shape parallel to the X-Y plane. The partition member 37a prohibits the air (cooling air F) that flows through the flow path 35c of the heat sink 35 from flowing to the inside of the second unit housing 37.

The substrate 39 includes, for example, a drive substrate or the like that drives and controls a switching element of the plurality of semiconductor elements 33 or the like.

Figure 3:
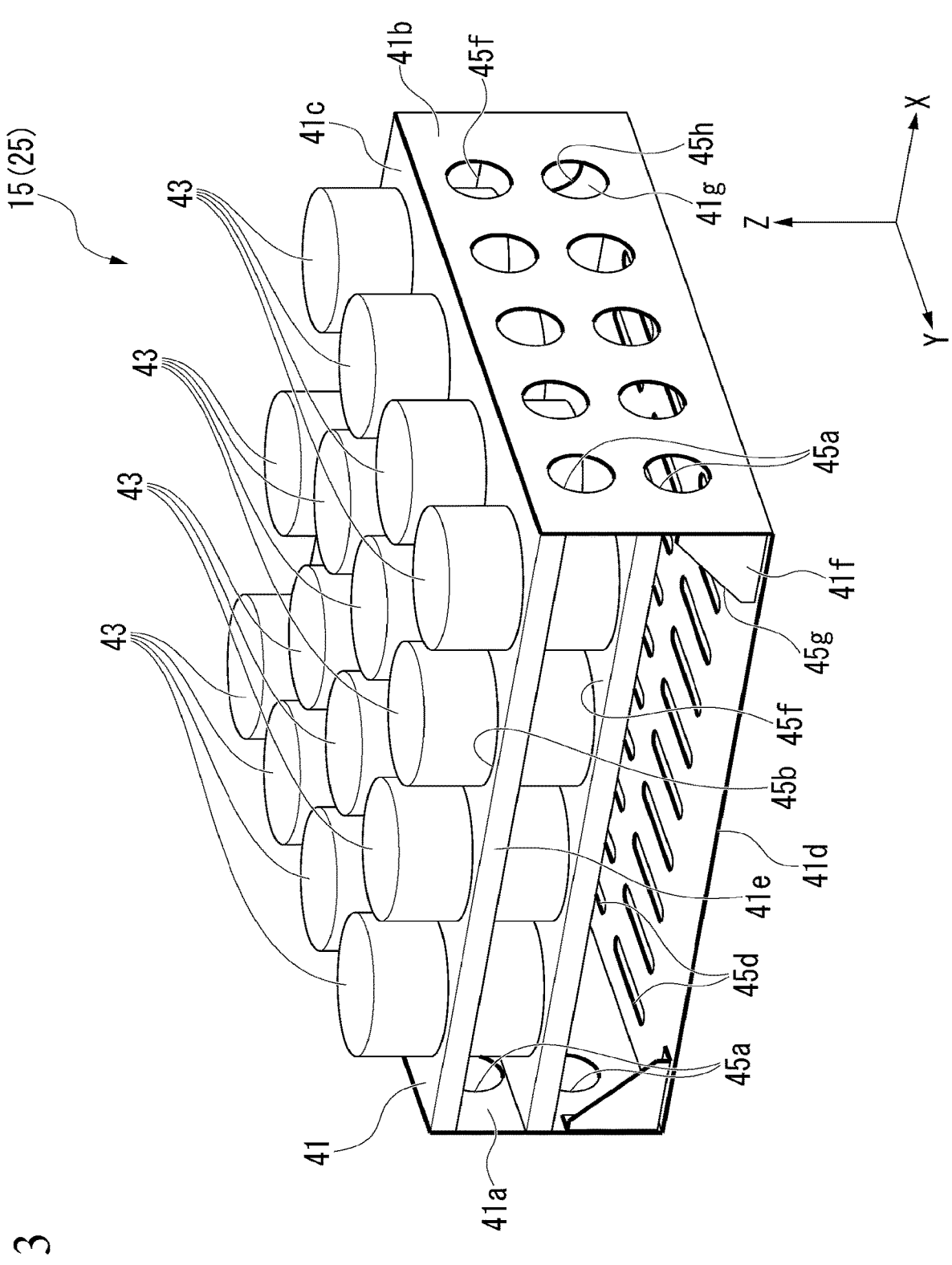
FIG. 3 is a perspective view showing a configuration of a capacitor unit in the electric power conversion unit of the embodiment.

FIG. 3 is a perspective view showing a configuration of the capacitor unit 25 in the electric power conversion unit 10 of the embodiment.

The capacitor unit 25 is arranged adjacent to the element unit 21 and the drive unit 23 along the Y-axis direction, for example, in a state where the capacitor unit 25 is separated from the element unit 21 and the drive unit 23.

As shown in FIG. 3, the capacitor unit 25 includes a third unit housing (an example of a support member in the claims) 41 and a plurality of capacitors (condensers: an example of an element and a second element in the claims) 43. The third unit housing 41 supports the plurality of capacitors 43 arranged at the inside of the third unit housing 41.

The third unit housing 41 includes, for example, a left side portion 41a and a right side portion 41b in the X-axis direction, an upper portion 41c and a lower portion 41d in the Z-axis direction, and a support member 41e between the upper portion 41c and the lower portion 41d.

The outer shape of each of the left side portion 41a and the right side portion 41b is, for example, a plate shape parallel to the Y-Z plane. A plurality of side openings (an example of a through hole in the claims) 45a through which air (cooling air F) passes are formed on each of the left side portion 41a and the right side portion 41b. Each side opening 45a is an opening that penetrates, for example, in a circular shape.

The outer shape of each of the upper portion 41c, the lower portion 41d, and the support member 41e is, for example, a plate shape parallel to the X-Y plane. A plurality of insertion holes 45b through which the plurality of capacitors 43 are inserted and a plurality of upper openings (an example of a through hole in the claims) 45c (refer to FIG. 5 described later) through which the air (cooling air F) passes are formed on the upper portion 41c. Each upper opening 45c is an opening that penetrates, for example, in a circular shape.

A plurality of lower openings (an example of a through hole in the claims) 45d through which the air (cooling air F) passes are formed on the lower portion 41d. Each lower opening 45d is an opening that penetrates, for example, in a rectangular shape having a round corner.

A plurality of support portion openings 45e (refer to FIG. 5 described later, an example of a through hole in the claims) through which the air (cooling air F) passes through are formed on the support member 41e on which the plurality of capacitors 43 are arranged. Each support portion opening 45e is an opening that penetrates, for example, in a circular shape.

A pair of openings 45f facing each other through which the air (cooling air F) passes along the Y-axis direction are formed between the upper portion 41c and the support member 41e arranged at a predetermined interval along the Z-axis direction. Each opening 45f is, for example, an opening having a rectangular shape.

An opening 45g through which the air (cooling air F) passes is formed on a front portion 41f in the Y-axis direction between the lower portion 41d and the support member 41e arranged at a predetermined interval along the Z-axis direction. The opening 45g is, for example, an opening having a trapezoidal shape.

A plurality of openings 45h through which the air (cooling air F) passes are formed on a rear portion 41g in the Y-axis direction between the lower portion 41d and the support member 41e. A plurality of openings 45h are, for example, an opening that penetrates in a circular shape.

Each capacitor 43 includes a capacitor or the like that smooths a voltage fluctuation which occurs, for example, in association with an on/off switching operation of the switching element of the plurality of semiconductor elements 33.

Figure 4:
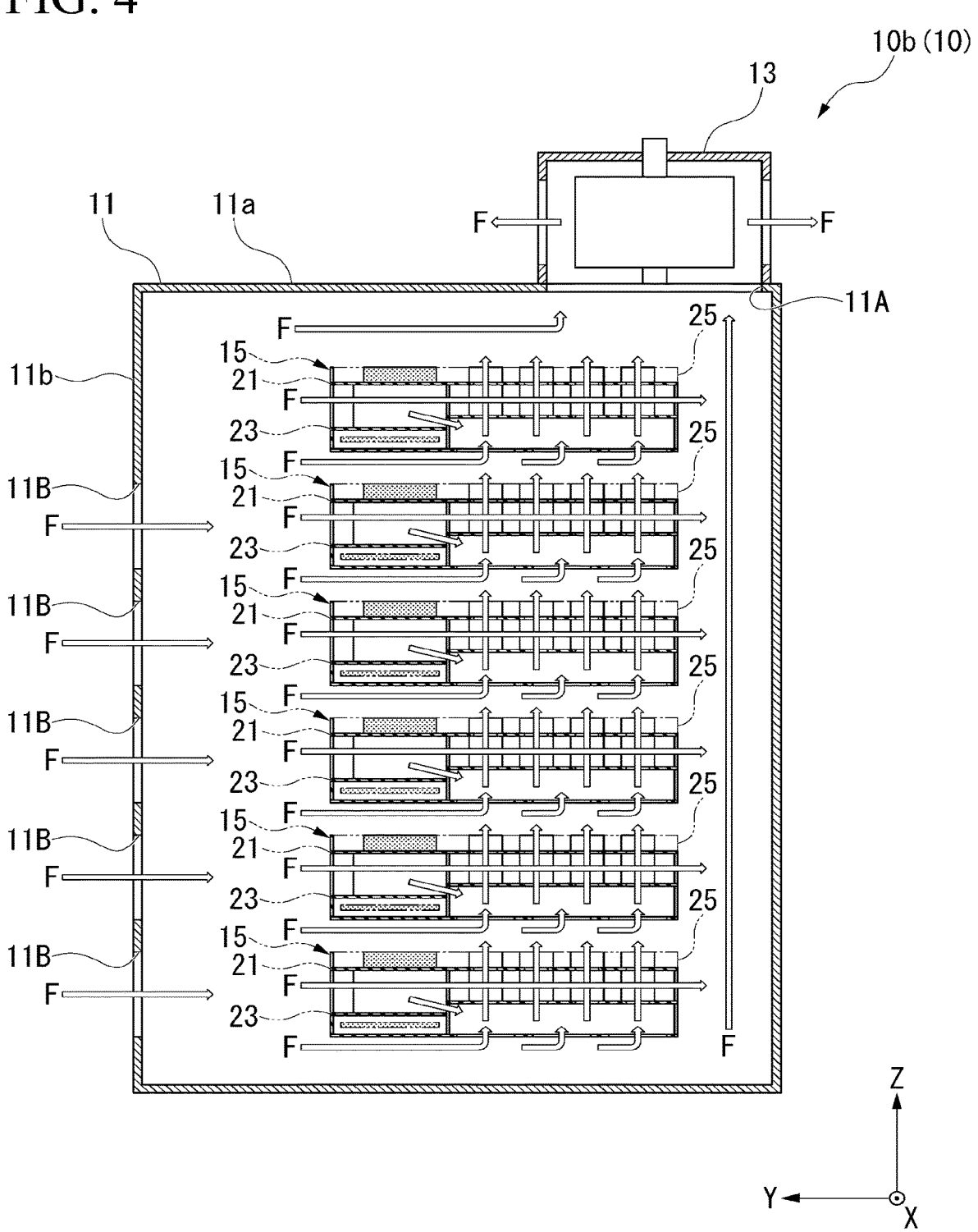
FIG. 4 is a cross-sectional view showing a flow of cooling air in the electric power conversion unit of the embodiment.
Figure 5:
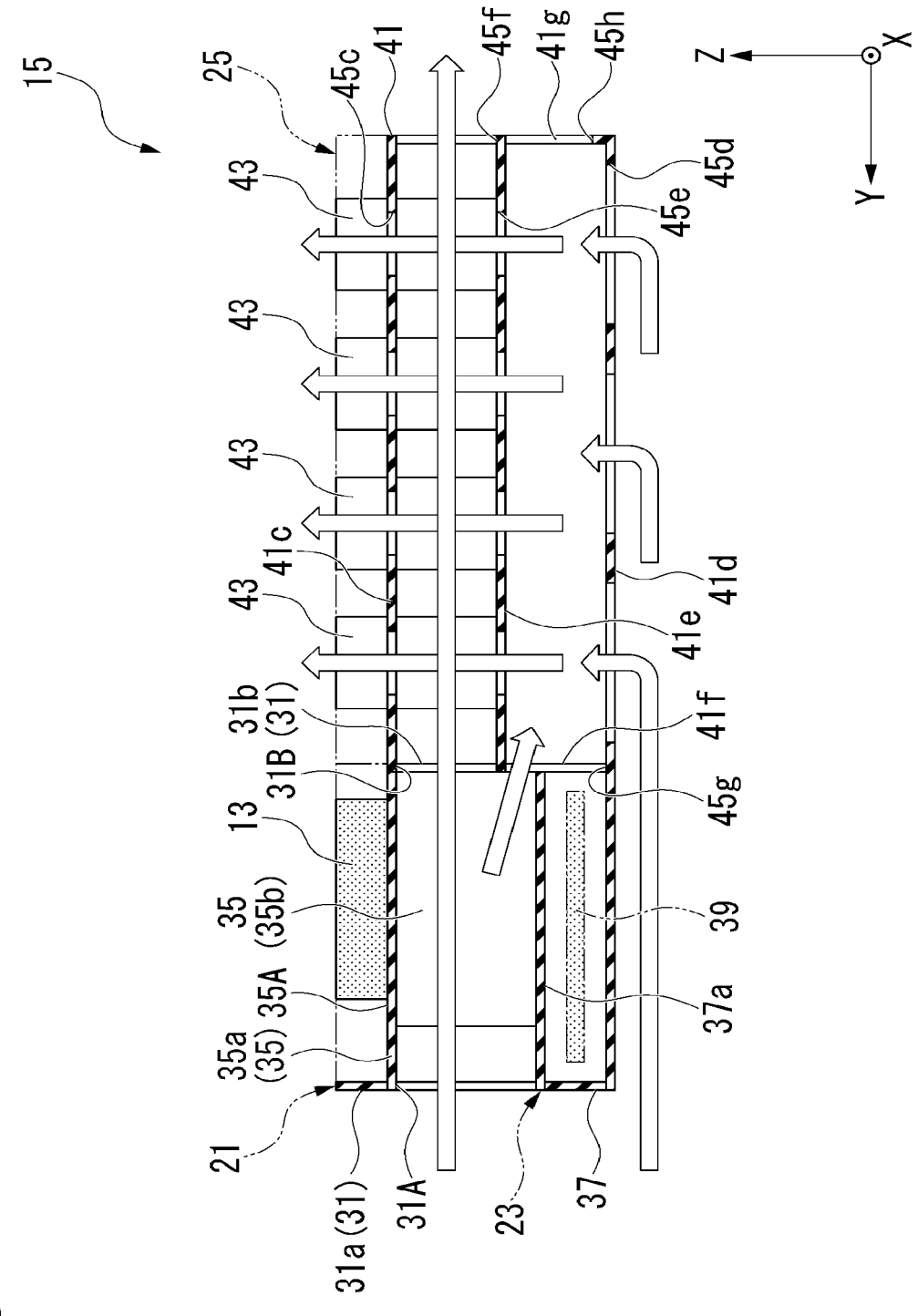
FIG. 5 is an enlarged cross-sectional view showing the flow of the cooling air in the element unit and the capacitor unit shown in FIG. 4.

FIG. 4 is a cross-sectional view showing a flow of cooling air F in the electric power conversion unit 10 of the embodiment. FIG. 5 is an enlarged cross-sectional view showing the flow of the cooling air F in the element unit 21 and the capacitor unit 25 shown in FIG. 4.

As shown in FIG. 4 and FIG. 5, air at the outside of the housing 11 is suctioned to the inside of the housing 11 through the plurality of intake ports 11B by the drive of the plurality of fans 13. The air that passes through the inside of the housing 11 is discharged to the outside of the housing 11 through each discharge port 11A and each fan 13. The air that passes through the inside of the housing 11 cools the plurality of electric power control units 15 by acting as the cooling air F in a flow route from each intake port 11B to each discharge port 11A.

First, the cooling air F that is suctioned from each intake port 11B to the inside of the housing 11 flows along the Y-axis direction toward the element unit 21 and the drive unit 23 of each electric power control unit 15.

The cooling air F that arrives at each electric power control unit 15 flows from the front opening 31A of the first unit housing 31 of the element unit 21 toward the heat sink 35. The cooling air F that passes through the flow path 35c formed by the heat sink 35 cools the plurality of semiconductor elements 33 arranged on the heat sink 35.

The cooling air F that passes through the heat sink 35 and the rear opening 31B of the first unit housing 31 flows through the inside of the third unit housing 41 of the capacitor unit 25. The cooling air F that flows through the inside of the third unit housing 41 between the upper portion 41c and the support member 41e flows between the plurality of capacitors 43 and thereby cools each capacitor 43.

The cooling air F that passes through the inside of the third unit housing 41 flows toward each discharge port 11A and each fan 13 and is discharged to the outside of the housing 11.

In the capacitor unit 25, the cooling air F passes through the plurality of side openings 45a, the plurality of upper openings 45c, the plurality of lower openings 45d, and the plurality of support portion openings 45e in each of the X-axis direction and the Z-axis direction in addition to the pair of openings 45f, the opening 45g, and the plurality of openings 45h in the Y-axis direction. The plurality of capacitor units 25 arranged to be aligned in the Z-axis direction function as a so-called air tunnel for the cooling air F that passes through the inside of the capacitor units 25 along the X-axis direction, the Y-axis direction, and the Z-axis direction.

In this way, the electric power conversion unit 10 described above includes the plurality of semiconductor elements 33 arranged to be aligned in one row along a direction perpendicular to the flow direction of the cooling air F. Therefore, it is possible to improve the cooling efficiency by the heat sink 35. For example, as compared to the case where the plurality of semiconductor elements 33 are arranged to be aligned in a plurality of rows along the flow direction of the cooling air F or the like, it is possible to actively cool each semiconductor element 33, and it is possible to decrease the length of the heat sink 35 in the flow direction of the cooling air F.

It is possible to prevent a semiconductor element 33 on the upstream side from thermally acting on a semiconductor element 33 on the downstream side and prevent the occurrence of temperature non-uniformity between the semiconductor element 33 on the upstream side and the semiconductor element 33 on the downstream side, for example, as in the case where the plurality of semiconductor elements 33 are aligned along the flow direction of the cooling air F or the like.

By preventing the flow route of the cooling air F in the heat sink 35 from increasing, it is possible to prevent the increase in the temperature gradient of the heat sink 35, and it is possible to prevent the increase in the pressure loss of the cooling air F. By reducing the pressure loss of the cooling air F, the wind speed of the cooling air F can be increased, and it is possible to improve the cooling efficiency of the plurality of semiconductor elements 33 and the plurality of capacitors 43. By decreasing the length of the heat sink 35 in the flow direction of the cooling air F and reducing the pressure loss of the cooling air F, it is possible to improve the cooling efficiency of another electric device arranged on the downstream side of the cooling air F.

The electric power conversion unit 10 described above includes the heat sink 35 arranged on the upstream side in the flow direction of the cooling air F. Therefore, it is possible to actively cool the plurality of semiconductor elements 33 arranged on the heat sink 35. For example, as compared to the case where the semiconductor element 33 that generates heat relatively greatly is arranged on a further downstream side in the flow direction of the cooling air F than another circuit element or the like, it is possible to efficiently cool the plurality of semiconductor elements 33.

The electric power conversion unit 10 described above includes the third unit housing 41 on which the plurality of side openings 45a, the plurality of upper openings 45c, the plurality of lower openings 45d, and the plurality of support portion openings 45e are formed. Therefore, it is possible to prompt the cooling air F to pass through the inside of the third unit housing 41. By causing a plurality of third unit housings 41 to function as an air tunnel, it is possible to prevent the increase of the pressure loss at the inside of the housing 11.

It is possible to prevent the need for providing a separate ventilation path of the cooling air F at the inside of the housing 11, and it is possible to prevent the housing 11 from becoming large. By reducing the pressure loss inside the housing 11, it is possible to improve the cooling capacity by the cooling air F at the inside of the housing 11, and it is possible to increase the capacity inside the housing 11. By the increase of the cooling capacity of the cooling air F, it is possible to prevent the increase in power consumption of each fan 13, and it is possible to downsize each fan 13.

The electric power conversion unit 10 described above includes the partition member 37a that separates the inside of the second unit housing 37 from the flow path 35c of the air formed by the heat sink 35. Therefore, it is possible to prevent the exhaust heat of the heat sink 35 from thermally acting on the substrate 39 inside the second unit housing 37.

The element unit 21 and the drive unit 23 are separated from the capacitor unit 25, and thereby, it is possible to improve the ease of maintenance.

Hereinafter, a modification example is described.

In the embodiment described above, the element unit 21, the drive unit 23, and the capacitor unit 25 may be separated from each other or may be formed integrally in any suitable combination.

According to at least one embodiment described above, by including the plurality of semiconductor elements 33 that are arranged and aligned in one row along a direction perpendicular to the flow direction of the cooling air F, it is possible to improve the cooling efficiency by the heat sink 35.

Although some embodiments of the present invention have been described, these embodiments are presented as an example and do not limit the scope of the invention.

These embodiments can be implemented in various other forms, and a variety of omissions, substitutions, and modifications can be made without departing from the scope of the invention. These embodiments and variations thereof are included in the scope and gist of the invention and are also included in the scope of the invention described in the appended claims and equivalence thereof.

DESCRIPTION OF THE REFERENCE SYMBOLS

10 Electric power conversion unit
11 Housing
13 Fan (fluid machine)
15 Electric power control unit
21 Element unit
23 Drive unit
25 Capacitor unit
31 First unit housing
33 Semiconductor element (element, first element)
35 Heat sink (heat release member)
35A Element arrangement plane
35*c* Flow path
37 Second unit housing
37*a* Partition member
39 Substrate
41 Third unit housing (support member)

43 Capacitor (condenser, element, second element)
45*a* Side opening (through hole)
45*c* Upper opening (through hole)
45*d* Lower opening (through hole)
45*e* Support portion opening (through hole)

The invention claimed is:

1. An electric power conversion unit comprising:
a first housing;
a fluid machine that generates a flow of a refrigerant at an inside of the first housing;
a heat release member that forms a flow path of the refrigerant on an upstream side of a flow route of the refrigerant at the inside of the first housing;
a plurality of first elements in which the first elements are arranged and aligned along a direction which intersects a flow direction of the refrigerant in the heat release member on an element arrangement plane of the heat release member;
a plurality of second elements in which the second elements are arranged on a further downstream side than the plurality of first elements in the flow route; and
a second housing that supports the plurality of second elements so as to cause the refrigerant to flow between adjacent second elements,
wherein the second housing includes:
an upper portion having a plate shape and having insertion holes in which the second elements are individually inserted,
a support member having a plate shape and on which the second elements are provided,
a plurality of upper openings through which the refrigerant passes, the upper openings being formed between the insertion holes in the upper portion, and
a plurality of support portion openings through which the refrigerant passes, the support portion openings being formed at positions that avoid the second elements of the support member.

2. The electric power conversion unit according to claim 1, comprising:
a partition member that forms a region separated from the flow path; and
a substrate that is arranged in the region and controls a drive of the plurality of first elements.

\* \* \* \* \*